United States Patent [19]

Chen

[11] 4,075,708
[45] Feb. 21, 1978

[54] LARGE CAPACITY MAJOR-MINOR LOOP BUBBLE DOMAIN MEMORY WITH REDUNDANCY

[75] Inventor: Thomas T. Chen, Yorba Linda, Calif.

[73] Assignee: Rockwell International Corporation, El Segundo, Calif.

[21] Appl. No.: 689,312

[22] Filed: May 24, 1976

[51] Int. Cl.² .............................................. G11C 19/08
[52] U.S. Cl. ........................................... 365/2; 365/1; 365/12; 365/13; 365/15; 365/35; 365/39
[58] Field of Search ................................. 340/174 TF

[56] References Cited

U.S. PATENT DOCUMENTS

| | | | |
|---|---|---|---|
| 3,703,712 | 11/1972 | Bobeck et al. | 340/174 TF |
| 3,971,005 | 7/1976 | Buhrer | 340/174 TF |
| 3,991,411 | 11/1976 | George | 340/174 TF |
| 4,015,249 | 3/1977 | Hu et al. | 340/174 TF |

*Primary Examiner*—James W. Moffitt
*Attorney, Agent, or Firm*—H. Fredrick Hamann; G. Donald Weber, Jr.

[57] ABSTRACT

A large capacity bubble memory device using a basic major-minor loop storage cell design. The basic storage cell is repeated, typically in matrix form, on a suitable bubble domain structure. The cell design is arranged so that interconnecting elements between respective cells permit magnetic bubble domains to be selectively transferred between cells in accordance with the status of switch elements. Control signals control the switch status. The cells include redundancy features so that cells can be interconnected to form a large capacity storage loop whereby chip yield is increased.

9 Claims, 6 Drawing Figures

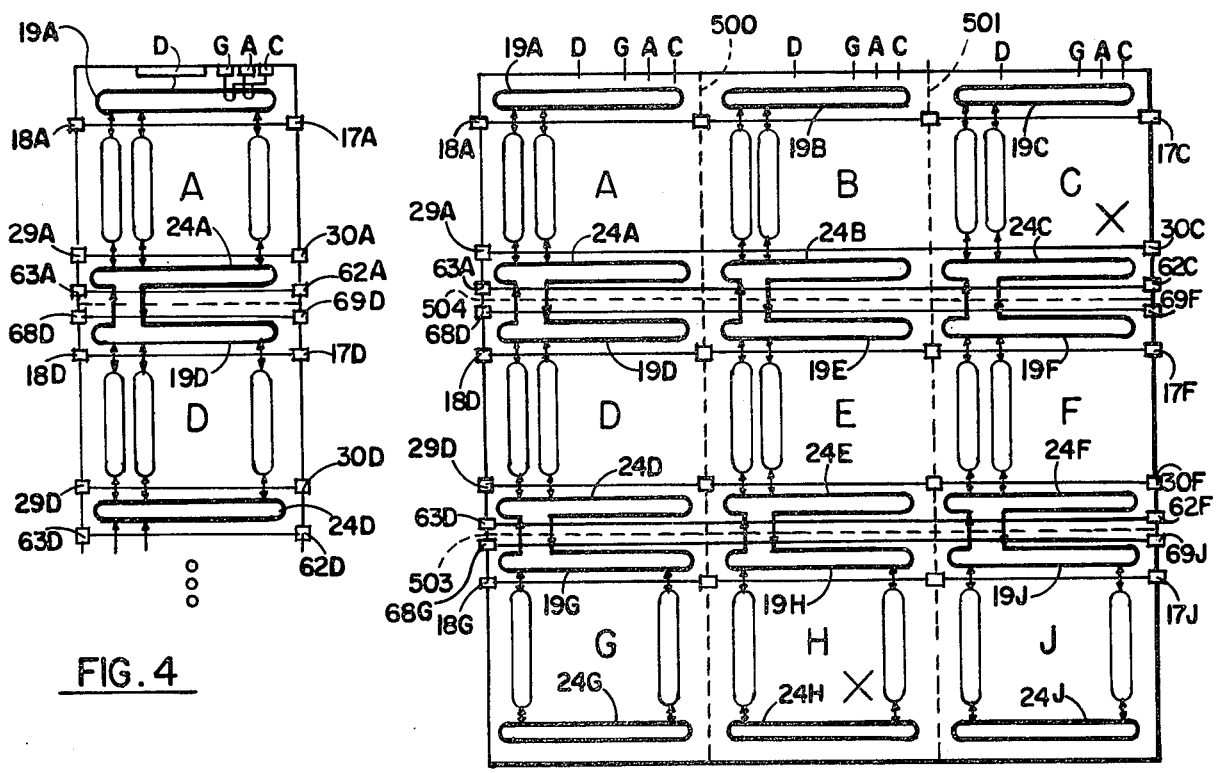
FIG. 4
FIG. 5
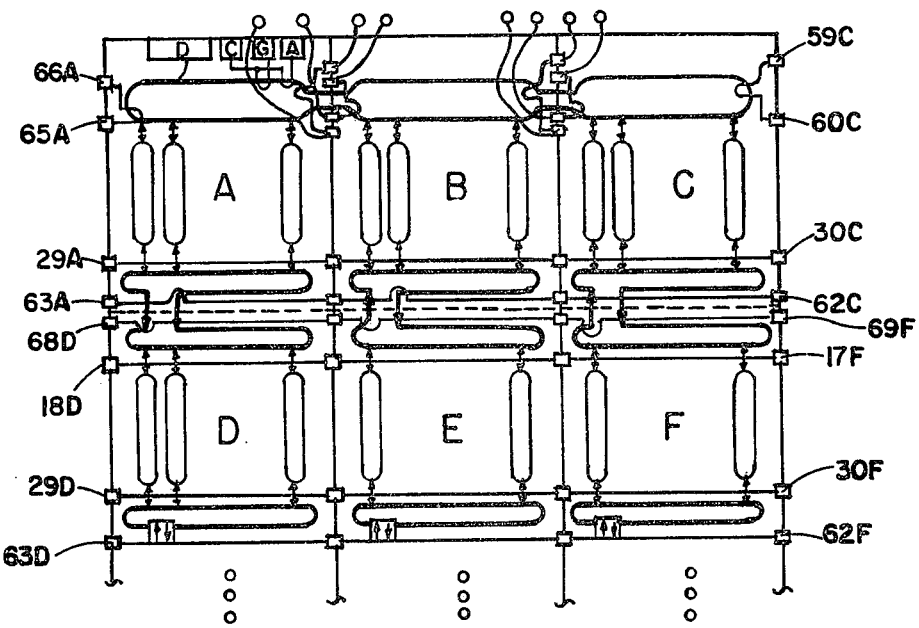
FIG. 6

LARGE CAPACITY MAJOR-MINOR LOOP BUBBLE DOMAIN MEMORY WITH REDUNDANCY

BACKGROUND

1. Field of the Invention

This invention relates to magnetic bubble domain systems, in general, and to relatively high yield, large capacity major/minor loop bubble domain memories, in particular.

2. Description of Prior Art

With the introduction of magnetic bubble domains, many devices have been developed. As these devices have been refined and improved, the bubble domain concept has progressed beyond the curiosity stage and into the realm of commercial utilization. To improve the utilization prospects, more and better systems and system applications are being inventigated and established. Some of the system applications include storage means such as memories.

In a bubble memory system, it is desirable to obtain maximum storage per individual chip in order to reduce the number of chips utilized. Where data storage capacity is the prime consideration and access time is of secondary importance, the total capacity of the individual memory chip is increased so that fewer chips are required. See, for example, copending application, Ser. No. 689,313; entitled Large Capacity Bubble Domain Memory with Redundancy, by T. T. Chen and I. S. Gergis; filed on May 24, 1976; assigned to the common assignee; and incorporated herein by reference. The utilization of smaller numbers of chips permits lower packaging and electronics costs as well as better system reliability. However, where increased throughput (or reduced access time) is desirable, the major-minor loop configuration is advantageous. This configuration permits the memory system to be arranged in smaller segments which can be accessed more quickly. In addition, certain access operations can be performed in parallel to increase operating speed and to reduce access time for information retrieval.

Presently known chip design capabilities use a basic memory cell which is processed photolithographically. The size of the cell is limited by the basic size of the mask which can be properly handled by the photoreduction process. Therefore, to increase the capacity of the chip, it is necessary to increase the storage density of the mask which is limited by the resolution of the photolithographic technique.

At present, bubble domain technology permits processing of a large number of memory cells on a relatively large garnet wafer with reasonable yield. However, when an improved method and design of a storage cell is provided, a large number of interconnected cells can be placed on a wafer.

SUMMARY OF THE INVENTION

There is described a major-minor loop bubble domain memory system having large storage capacity as well as significant flexibility in loop interconnections. The basic storage cell design includes interconnection means whereby interfacing between basic cells can be achieved. The basic cell includes at least two major loops and an appropriate number of minor loops to be used as storage loops, along with detector, generator and other well known control devices. A plurality of the cells are placed on a garnet wafer in matrix form and the interconnection elements provide interconnection between the cells. By appropriately selecting the interconnection element, a tolerance to misalignment in cell positioning (due to the step/repeat process) permits the plurality of cells to interact appropriately. Also, the cells include exchange switches between the major and minor loops. Double switches are provided to selectively interconnect the major loops of adjacent cells. When the basic storage cells are connected and the appropriate storage or alternative paths are selected, a large-capacity, major-minor loop bubble domain memory is implemented.

DESCRIPTION OF THE DRAWINGS

FIGS. 3 through 6 are schematic representations of a wafer with a plurality of storage cells thereon in different system configurations.

DESCRIPTION OF THE PREFERRED EMBODIMENT

Figure 1:
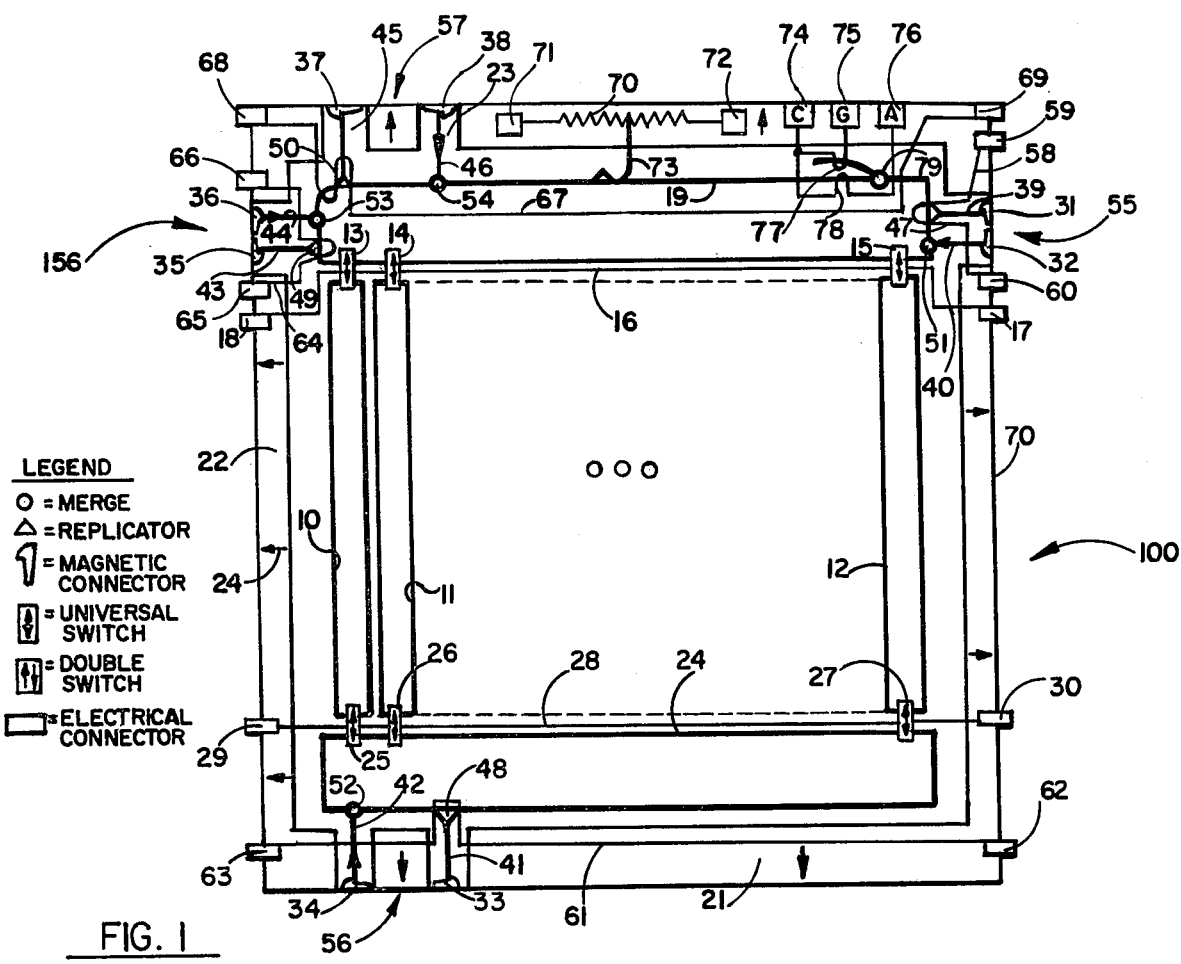
FIG. 1 is a detailed showing of an individual major/minor loop cell which forms the instant invention.

Referring now to FIG. 1, there is shown a schematic representation of a cell design for a major/minor bubble domain circuit configuration. Cell 100 is designed to be substantially modular so that the cells can be produced in the usual "step and repeat" process. As is known, in this process a mask is prepared and applied to a bubble domain material wafer in a step and repeat fashion wherein the cell is repeatedly reproduced on the wafer. In order to permit such an operation to be successful in the preparation of a composite (multi-cell) chip, the modular cell must enhance the aforesaid process by means of the careful design of the cell.

As noted, cell 100 is a major/minor loop arrangement. A plurality of minor loops 10, 11 and 12 are disposed in the cell. While only three such loops are shown, any number of loops can be incorporated as a function of the size of the cell and the propagation path technique which is being used. Primary major loop 19 is associated with and disposed adjacent one end of each of the minor loops. Each of the minor loops is separately coupled to primary major loop 19 by means of respective exchange switches 13, 14, 15 and the like. Suitable exchange switches are known in the art and are described in copending applications, Ser. No. 688,652; entitled Compact Exchange Switch For Bubble Domain Devices by I. S. Gergis and T. T. Chen; and Ser. No. 688,651; entitled Data Processing Switch for Bubble Memory Organization; by T. T. Chen; filed on May 21, 1976, respectively; assigned to the common assignee; and incorporated herein by reference.

Secondary major loop 24 is associated with and coupled to the other ends of each of the minor loops. Each of the minor loops is individually coupled to the secondary major loop 24 by means of respective exchange switches 25, 26 and 27. Again, exchange switches 25, 26 and 27 may be similar to exchange switches 13, 14 and 15.

Exchange switches 13, 14 and 15 include control conductor 16 which passes therethrough in accordance with the configuration of the specific exchange switch which is utilized. Control conductor 16 is connected to pads 17 and 18, respectively. Likewise, exchange switches 25, 26 and 27 are linked by control conductor 28 in the appropriate fashion. Connector pads 29 and 30 are connected to conductor 28.

A guardrail of suitable configuration is arranged around the perimeter of cell 100. The guardrail portions 20, 21, 22 and 23 are arranged to propagate bubbles in the direction indicated by the arrows, such as arrow 24. These guardrail sections cause any spurious bubbles to be propagated toward the perimeter of the chip under the influence of rotating field $H_R$ (not shown) wherein the various bubbles are then annihilated in a suitable fashion. It is noted that contact pads such as 17, 18, 29 and 30 (as well as others) are arranged to project through and beyond the guardrail. That is, when the cell mask is prepared, the contact pads are arranged to extend beyond the outer periphery of the cell, per se, in order to improve the inteconnection capabilities between cells.

A plurality of "fat-T" or half disc elements 31-38, inclusive, are provided at the periphery of the cell. The fat-T's are utilized to interconnect the permalloy portions (i.e. propagation paths) of the bubble domain circuit. The fat-T elements provide an interconnection capability such as is described in copending application, Ser. No. 689,313; entitled Large Capacity Bubble Domain Memory With Redundancy, by Chen et al, and noted supra. Each of the fat-T elements 31-38, inclusive, has associated therewith a separate propagation path 39-46, respectively. These propagation paths are constructed in a suitable manner, i.e. using standard elements such as T-bars, I-bars, chevrons or the like. Propagation paths 39, 41, 43 and 45 are connected to transfer switches 47-50, respectively. Propagation paths 40, 42, 44 and 46 are connected to merge components 51-54, respectively. Transfer switch 48 and merge 52 are associated with and coupled to secondary storage major loop 24 while the remainder of the transfer switches and merge components are associated with and coupled to primary major loop 19.

It will be noted that the associated combinations of junction elements such as the pair of fat-T elements, propagation paths and merge and transfer switch form the structural components of one-half of a double switch. For example, fat-T elements 33 and 34, along with propagation paths 41 and 42, as well as transfer switch 48 and merge 52 comprise half-double switch 56. Likewise, half-double switches 55, 56 and 57 are formed using the respective fat-T elements, propagation paths, transfer switches and merge components. When any two of the associated half-switches, such as half-double switches 57 and 56, are conjoined, a double switch is established.

Each of the half-double switches includes a control conductor and associated contact pads. For example, half-double switch 55 includes conductor 58 along with pads 59 and 60. Half-double switch 56 includes conductor 61 along with pads 62 and 63. Half-double switch 156 includes conductor 64 along with pads 65 and 66. Half-double switch 57 includes conductor 67 along with pads 68 and 69.

Also included in each cell is detector 70 with pads 71 and 72 of typical configuration. Detector 70 receives signals from replicate switch 73 which is associated with and part of primary major loop 19. Generator 77 and annihilator 78 are represented by loop structures as are known in the art. These components are connected to contact pads 75 and 76, respectively, and to common pad 74 to permit control current signals to be supplied thereto selectively. Generator 77 is connected by a suitable propagation path to merge 79 whereby signals (i.e. presence or absence of bubble) may be supplied to primary major loop 19.

In operation, current (or voltage) signals are selectively applied to contact pads 75 to produce current in generator loop 77 whereby bubbles are supplied to primary major loop 19 via merge 79. Bubbles are, thus, stored in primary major loop 19 and circulated therearound under the influence of the magnetic fields. When it is desired to transfer data signals (bubbles) from primary loop 19 (or to exchange bubbles from major loop 19 to the minor loops), control current signals are supplied to pads 17 and 18 to selectively energize exchange switches 13, 14, 15 and so forth. The bubbles in primary loop 19 are, thus, selectively exchanged with bubbles (or lack thereof) in loops 10, 11, 12, and so forth. Of course, if any bubbles are circulating in loops 10, 11 and 12 when the control signal is supplied to pads 17, 18 and conductor 16, bubbles in the minor loops are selectively exchanged with the bubbles in the primary major loop 19 propagate therearound and are replicated via replicator 73 and directed to detector 70 whereby the signals are supplied to external circuitry of any suitable type via pads 71 and 72.

It is sometimes desirable to transfer bubbles from minor storage loops 10, 11 and 12 to a secondary major loop 24. This transfer or exchange is effected by applying appropriate control signals at pads 29 ad 30 wherein a current is supplied to conductor 28. The exchange process is similar to the exchange between the storage loops and primary loop 19 as discussed supra and as described in the copending applications noted above.

In addition, the bubbles which are circulating in secondary major loop 24 may be selectively propagated through double switch 56 to an external circuit (see infra). That is, by selectively applying a control current to conductor 61 via pads 62 and 63, double switch 56 can be activated. Thus, the one way transfer switch 48 causes bubbles to propagate along secondary major loop 24 through switch 48 to propagation path 41 and fat-T element 33. Concurrently, bubbles will propagate from fat-T element 34 along propagation path 42 through merge 52 to loop 24. No bubbles will propagate along that portion of loop 24 which is disposed between switch 48 and merge 52. This switch arrangement permits secondary loop 24 to be interconnected with additional circuitry in an adjoining cell. Likewise, application of a control signal to pads 65 and 66 permits fat-T elements 35 and 36 to be connected to primary loop 19. In addition, application of a control signal to pads 59 ad 60 permits primary loop 19 to be connected to external circuitry in another cell via double switch 55. A similar connection to external circuitry can be effected through fat-T elements 37 and 38 by the application of a control signal to pads 68 and 69 which are associated with double switch 57. Thus, with the appropriate operation of the double switches 55, 56, 156 and 57, interconnections can be made between a plurality of cells as shown and described hereinafter.

Figure 2:
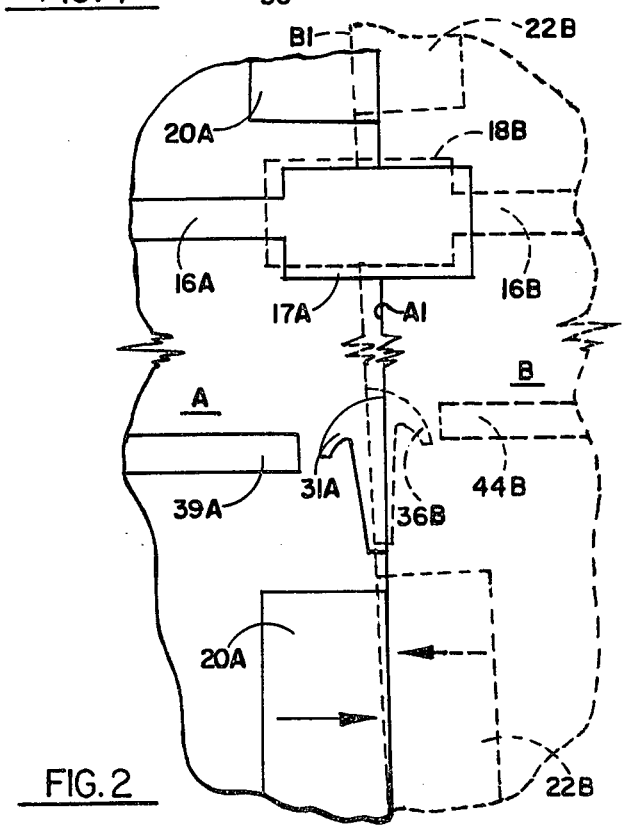
FIG. 2 is a more detailed showing of interconnection elements of abutted cells.

Referring now to FIG. 2, there is shown an enlargement of portions of two adjacent cells. Cells A and B are adjoining cells as suggested in FIGS. 3 through 6. As discussed supra, bubble domain circuits are made by preparing a mask and applying the mask, in a step and repeat fashion, until an appropriate number of cells are established on a wafer. As is described in the copending application by T. Chen et al (Large Capacity Memory), the step and repeat function is subject to some misalignment problems. While ideally edges A1 and B1 of cells A and B would exactly coincide and the elements of the respective cells would be exactly aligned, certain misalignment errors frequently occur. The misalignment can be in a vertical offset, a horizontal offset or some combination of both. However, so long as the horizontal alignment is not such to produce a space between cells, the instant invention is forgiving in many alignment errors.

As shown in FIG. 2, cells A and B are skewed relative to each other wherein both a horizontal and a vertical alignment error occurs. Nevertheless, it is seen that conductor pad 17A substantially overlaps conductor pad 16B wherein conductors 16A and 16B are in electrical contact. Consequently, application of a signal along conductor 16A will produce a similar signal along conductor 16B. In addition, fat-T elements 31A and 36B are shown in overlapping relationship. These elements are aligned with propagation paths 39A and 44B, respectively. The propagation paths may be of any type path such as T-bars, I-bars, chevrons or the like. Similarly, elements 20A and 22B represent guardrails which propagate bubbles in the directions shown by the arrows.

Figure 3:
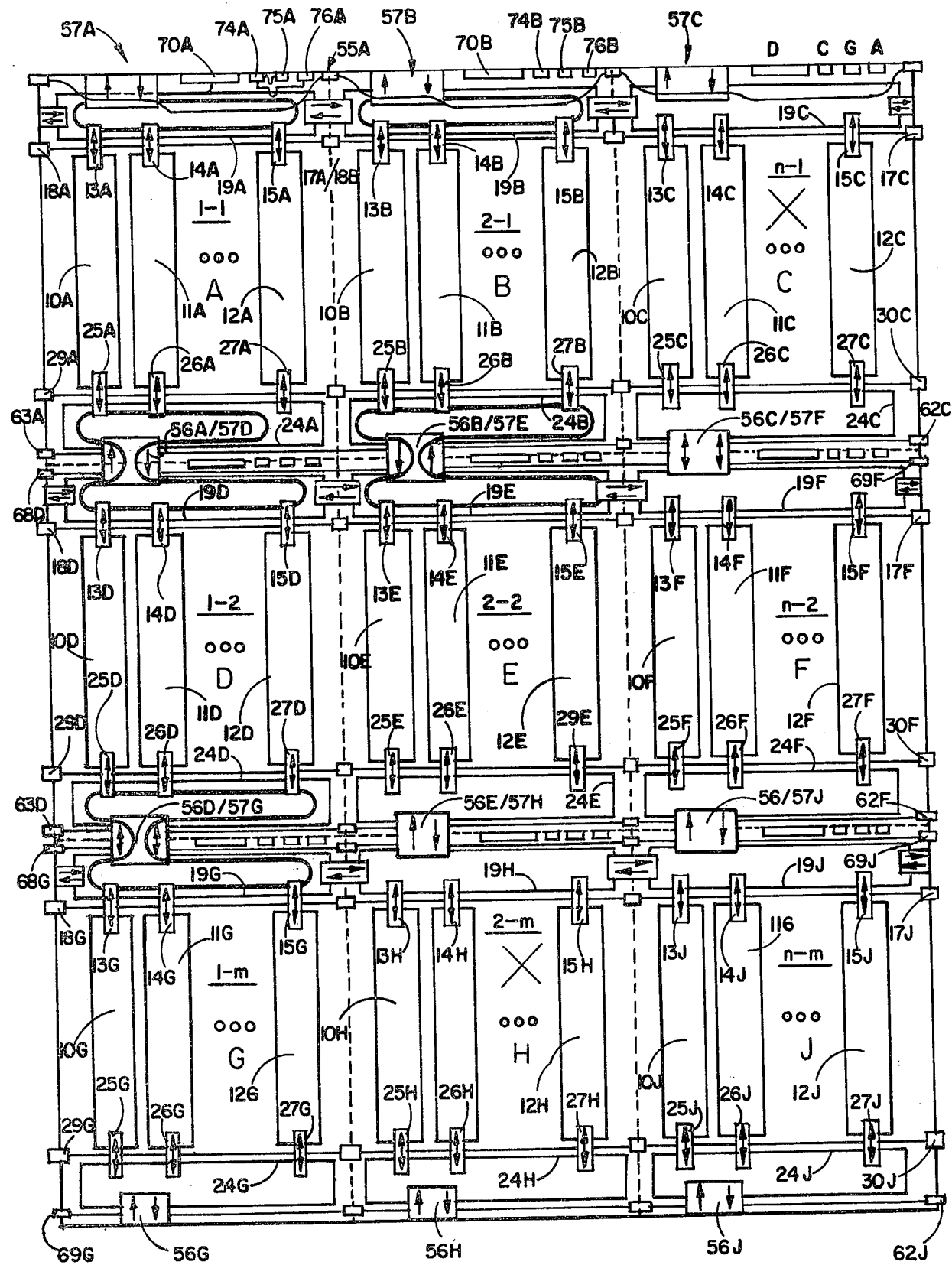

Referring now to FIG. 3, there is shown a matrix comprising a plurality of cells similar to those shown in FIG. 1. While nine cells, identified as cells A–J are shown, any number of cells can be utilized (within the confines of the mask forming techniques as well as the size of the wafer.) The array shown in FIG. 3 illustrates a vertical interconnection of cells. That is, as will appear hereinafter, cells are interconnected so that cells A, D and G are related. Similarly, cells B, E and H are related as well as cells C, F and J. The interrelationship of the cells is established by applying a current signal at pad 68D which signal effectively activates double switch 57D/56A. Concurrently, double switches 56B/57E and 56C/57F are also activated. Thus, secondary major loop 24A (cell A) is interconnected with primary major loop 19D (cell D) via double switch 56A/57D. As a result, loops 24A and 19D are connected in series to form a single continuous loop when the control signal is applied. Loops 24B and 19E are similarly interconnected. Any other interconnections which are to be accomplished between major loops of vertically adjacent cells can be accomplished by the application of a control signal to the double switches.

It is noted that even though the conductor pads of double switches 55A/156B are interconnected, no control signals are supplied thereto to effect a horizontal connection of major loops 19A and 19B. Consequently, the vertical interconnection suggested in FIG. 3 permits the effect of relatively short major loop 19A along with relatively long minor loops 10A, 11A and so forth inasmuch as these minor loops are, in effect, connected to the counterpart minor loops 10D, 11D, 10G, 11G and so forth via major loops 24A and 19D.

In this arrangement, each of the primary major loops 19A, 19B and 19C (and other primary major loops in the first row of cells) have control elements associated therewith. For example, detectors 70A, 70B and so forth are utilized to detect signals from the primary major loops in accordance with circuit configurations shown in FIG. 1. Likewise, the contact pads 74A, 75A and 76A along with pads 74B, 75B and 76B and the like are utilized to provide control signals to the memory system as shown and suggested relative to FIG. 1. These control signals are supplied and output signals are detected relative to the associated primary major loop.

The primary major loop 19 receives signals (i.e. bubbles) from storage loops 10A, 11A, 12A and so forth via exchange switches 13A, 14A and 15A. Similarly, loop 19B receives signals from storage loops 10B, 11B, 12B and so forth via exchange switches 13B, 14B and 15B. The information stored in the storage loops can be selectively altered by applying a control signal at pad 29A to control the status of exchange switches 25A, 26A and 27A as well as exchange switches 25B, 26B and 27B. Thus, the information stored in major loop 24A (or 24B) is selectively exchanged with the information stored in storage loops 10, 11 and 12 (with the appropriate suffix).

Again, by applying a control signal to pads 63A and 68D, double switches 56A/57D and 56B/57E are controlled to selectively interconnect major loops 24A and 19D as well as major loops 24B and 19E. Thus, information which has been stored in either of these loops can be controlled, supplemented, complemented or replaced. Reference is made to copending application Ser. No. 688,651; entitled Data Processing Switch; by T. T. Chen et al; filed on May 21, 1976; assigned to the common assignee and incorporated herein by reference in order to describe the operation thereof.

By application of a control signal to pad 18D, exchange switches 13D, 14D and 15D are operated to selectively exchange information between loops 10D, 11D, 12D (and so forth) and major loop 19D. Again, these loops may be selectively coupled to additional major loops in accordance with the vertical array shown and suggested in FIG. 3.

The number of cells interconnected and/or associated in this manner is largely a function of the success in fabricating useful cells on a wafer. Obviously, the matrix cannot be larger than the geometry of the wafer on which it is located. In addition, inasmuch as there are frequently inoperable cells produced by the techniques, such cells are not connectable or usable in the system. For example, in the embodiment shown in FIG. 3, cells C and H are marked with an X which indicates that these cells are defective. The entire column comprising cells C, F and J can be excluded from the circuit. Conversely, cell C can be omitted and cells F and J can be utilized in an interconnected mode. In that situation, the control elements 70F, 74F, 75F and 76F of cell F are utilized to control the operation of this cell group.

Referring now to FIGS. 4, 5 and 6, there are shown various arrangements of bubble domain systems which can be fabricated in accordance with the circuit scheme shown and described supra. In particular, in FIG. 4 there is shown a vertical integration of a pair of cells, namely cells A and D. In this particular combination, secondary major loop 24A of cell A is connected to primary major loop 19D of cell D by double switch 56/57. Similarly, secondary major loop 24D of cell D can be interconnected with the next adjacent primary major loop of the next adjacent cell (not shown) via the appropriate double switch 56/n. Under these circumstances, information from the storage loops (10, 11, 12)D in cell D can be exchanged with information in the connected major loops of cells A and D. Likewise, the information in these combined major loops can be exchanged with information in the storage loops (10, 11, 12)A in cell A. Consequently, information in a lower tier cell (e.g. cell D) can be exchanged for information stored in an upper tier cell (e.g. cell A). This type of vertical, single level integration is readily achievable with the instant apparatus. Moreover, while only cells A and D are shown, additional cells can be connected in a similar manner.

Referring now to FIG. 5, it is seen how the system as shown in FIGS. 3 and 4 can be fabricated. Initially, referring concurrently to FIG. 3, it is seen that cells A–J are provided. In the example given in FIG. 3, cells C and H are defined as being defective for some reason. Depending upon the type of system required, the appropriate signal can be applied whereby secondary major loops (24) of cells A and B are connected to the primary loops (19) of cells D and E, respectively. Likewise, secondary major loop 24D of cell D may be connected to primary major loop 19G of cell G. However, with the existing conditions, i.e. defective cell H, it is undesirable to interconnect secondary major loop 24E of cell E with primary major loop 19H of cell H inasmuch as information may be lost in this instance. Consequently, it is generally desirable to remove cell H from the system by the expedient of physically cutting cell H from the wafer. Likewise, it is desirable to remove cells C, F and J from the wafer by cutting along line 501. This operation establishes a system comprising cells A, B, D, E and G. Inasmuch as it is frequently more desirable to have 2 × 2 cell array or memory arrangement, cell G may also be removed as well.

On the other hand, if a single dimensional 1 × 3 matrix array of cells is desired, the wafer may be cut along line 500 wherein cells A, D and G are interconnected as shown in FIG. 4. By then cutting along line 501, wafer units comprising cells B, E, H and C, F and J are produced. By cutting along line 503 between cells E and H and along line 504 between cells C and F, two 1 × 2 matrix cell arrangements comprising cells B and E, and F and J, respectively, are provided.

FIG. 6 shows an example of a two-dimensional wafer integration. As is seen, the major primary loops 19 of cells A, B, and C are magnetically interconnected together via double switches 55A/156B and 55B/156C, respectively. This connection is effected by applying the appropriate signal to contact pads 66B and 65B and the counterparts in the other cells. The same signal is also supplied to contact pads 59A and 60A as well as the counterpart contact pads in other cells in the first row of the matrix. Of course, if additional cells are arranged on the wafer in a horiztonal manner, such additional cells may be connected to the cells A, B and C in a manner similar to that shown. In addition, secondary major loop 24 of cells A, B and C are connected to primary major loops 19 of cells D, E and F, respectively. Again, the secondary major loops 24 of cells D, E and F can be interconnected with the primary major loop 19 of adjacent cells, not shown. It must be noted that, in the two-dimensional chip organization, primary major loops 19D, 19E, 19F and so forth in the cells not in the first tier are not connected in series. However, primary major loops 19 in the cells in rows other than the first row are, individiually, connected to secondary major loop 24 in the vertically adjacent cell. Thus, loop 19D is connected to loop 24A, and so forth. This circuit structure permits the selective exchange of information from cell D with information in cell C via the interconnected primary major loops 19 of cells A, B and C, respectively.

The two-dimensional wafer integration scheme shown in FIG. 6 has the disadvantage that additional double switch controls are required. These double sswitch controls may be established by wire bonding to bonding pads which are located elsewhere on a printed circuit board or suitable support substrate on which the momory wafer is supported. However, this system has the distinct advantage that it eliminates all but one set of generator, annihilator and detector components. Moreover, inasmuch as the first primary major loop in the chip organization is an extremely long loop, a large amount of information may be stored therein. In order to avoid any delay in throughput, the detector may be associated with a particular cell. This cell can be appropriately selected by means not important to this invention in an appropriate manner whereby information is processed in a suitable order and is detected by the detector in a similar recovery mode. The throughput for the entire system is not diminished and is not substantially delayed inasmuch as information stored in any of the storage loops in any of the cells A, B, C (horizontally) or A, D, G (vertically) will remain approximately the same. The transfer time for moving information from cell G to cell A is substantially the same as in the vertical or two-dimensional integration scheme. By appropriate interaction in terms of exchanging the information from cell A to the first primary loop (19) the delay in circulation of information through loop 19 can be minimized.

Thus, there are shown one and two-dimensional integration schemes which are achievable with the system shown and described relative to FIG. 1 in particular. This arrangement permits "off-chip" control of the device. That is, by applying control signals to pads associated with the structure, the horizontal and/or vertical integration thereof can be controlled. There is no necessity to alter the structure of the system as it is produced on the wafer. Consequently, the difficulty in obtaining high precision, high resolution masking and etching of an existing wafer layout is avoided.

In summary, high density bubble devices are fabricated by E-beam microfabricator and X-ray lithography techniques. The digital microfabricator with a laser interferometer stage is capable of delineating patterns over a 4 in. × 4 in. area by using a step and repeat technique on a basic pattern. Thus, when bubble transport and control functions are coupled between the basic elements of the array, a chip as large as the microfabricator's capability, or garnet wafer size, can be made. Such a large storage system could not be conceived with bubble technology without such an approach. The essential requirement is for fabrication techniques which permit magnetic and electrical connection between the basic cells.

Alignment accuracy between the basic cells by E-beam techniques is about 0.1 $\mu$m. The interface element which is used must tolerate this amount of misalignment. Thus, it is possible to magnetically interconnect the bubble streams in two neighboring patterns. The interface element, a widened mushroom type permalloy structure (i.e. fat-T) is similar to the half-disc corner. With the widened permalloy and the enhanced center pole, the bubble will propagate in strip form and, thus, can tolerate some shape variation in the structure due to misalignment in the composition between two adjacent patterns.

Bubbles are usually accessed through electrical control, that is by transfer or replicate switches or decoders. When many separate storage loops (or chips) are used, the electrical control conductors can be connected in series so that all the loops (or chips) can share one set of control electronics. Examples of this are the conventional major/minor loop, the discretionary wired organization, the coincident selection organization as well as other systems.

Electrical interconnection techniques can be extended to the wafer level integration approach which will extend the chip capacity without significantly increasing the number of leads to the chip. In addition, defective parts of the chips can be excluded at the system level without a physical correction step. The integration can also be extended to chips on the same wafer.

Thus, there has been shown and described a composite chip concept wherein magnetically interconnected storage cells form a major/minor loop chip organization. The memory capacity of the chip is maximized and access time is minimized. By proper interconnection of the defect-free cells on a wafer, a large capacity bubble domain memory can be achieved. By providing suitable control electronics, defective loops can be effectively eliminated from the chip. By using the method and apparatus described herein, greater yield on processed wafers can be achieved.

To those skilled in the art, certain modifications to the instant invention may become apparent. In addition, certain bubble domain devices and structures are shown and described. Other devices or structures which fulfill the requirements of the invention can be utilized. Any modifications in the system or utilization of different component devices or structures is intended to be included within the purview of this description.

Having thus described a preferred embodiment of the invention, what is claimed is:

1. A large capacity memory comprising
   a plurality of substantially similar modules,
   interconnecting means at the edges of each module for interconnecting the modules,
   said interconnecting means having sufficient size to permit reasonable tolerance in alignment thereof while permitting interconnection of the modules,
   each of said modules including:
   a primary major loop,
   a secondary major loop,
   at least one minor loop coupled to said primary major loop and to said secondary major loop to permit the selective interchange of information between the respective loops, and
   junction means connected between said primary major loop and said secondary major loop and at least some of said interconnecting means to permit the selective interchange of information between the associated major loops of adjacent interconnected modules.

2. The memory recited in claim 1 wherein
   said modules are formed in a magnetic bubble domain material so that said memory stores information in the form of magnetic bubble domains.

3. The memory recited in claim 1 including
   active switch means connected between said minor loop and each of said primary major loop and said secondary major loop to provide the coupling therebetween.

4. The memory recited in claim 1 wherein
   said junction means includes passive merge means and active replicator means.

5. The memory recited in claim 1 wherein
   each module includes control functions for generating and detecting magnetic bubble domains in the memory.

6. The memory recited in claim 1 wherein
   said major loops, said minor loops, and said junction means comprise magnetic bubble domain propagation paths.

7. The memory recited in claim 1 including
   conductor means connected to some of said interconnecting means to establish a signal path through a plurality of said modules.

8. The memory recited in claim 1 wherein
   said primary major loop in one module is connected to the secondary major loop in another module via said interconnecting means.

9. The memory recited in claim 8 wherein
   said primary major loop in said another module is connected to the primary major loop in a further module via further ones of said interconnecting means.

* * * * *